(12) United States Patent
Naruse et al.

(10) Patent No.: US 6,621,378 B2
(45) Date of Patent: Sep. 16, 2003

(54) FILTER

(75) Inventors: Takumi Naruse, Miyazaki (JP); Kuniaki Kiyosue, Miyazaki (JP); Hiromi Sakita, Miyazaki (JP); Kenzo Isozaki, Miyazaki (JP); Kazuhiro Eguchi, Miyazaki (JP); Katsumi Sasaki, Miyazaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/879,018

(22) Filed: Jun. 12, 2001

(65) Prior Publication Data
US 2002/0021191 A1 Feb. 21, 2002

(30) Foreign Application Priority Data

Jun. 15, 2000 (JP) .......................... 2000-179667

(51) Int. Cl.$^7$ ................................ H03H 7/01
(52) U.S. Cl. ........................ 333/185; 333/175
(58) Field of Search ................ 333/185, 186, 333/175, 12, 181; 336/200

(56) References Cited

U.S. PATENT DOCUMENTS

| | | | | |
|---|---|---|---|---|
| 4,400,674 A | * | 8/1983 | Suda et al. | 336/65 |
| 4,752,752 A | | 6/1988 | Okubo | |
| 4,821,005 A | * | 4/1989 | Kling | 333/167 |
| 5,282,759 A | * | 2/1994 | Sakamoto et al. | 439/620 |
| 5,414,402 A | * | 5/1995 | Mandai et al. | 336/200 |
| 5,447,779 A | * | 9/1995 | Imaichi et al. | 428/209 |
| 5,543,755 A | | 8/1996 | Kumeji et al. | |
| 5,910,755 A | * | 6/1999 | Mishiro et al. | 333/24 |
| 5,959,515 A | * | 9/1999 | Cornett et al. | 334/14 |
| 6,094,112 A | * | 7/2000 | Goldberger et al. | 333/185 |
| 6,242,996 B1 | * | 6/2001 | Sato et al. | 336/200 |
| 6,384,688 B1 | * | 5/2002 | Fufioka et al. | 330/302 |

FOREIGN PATENT DOCUMENTS

| | | |
|---|---|---|
| DE | 43 40 594 | 6/1994 |
| EP | 0 685 857 | 9/1999 |
| JP | S61-9918 | 1/1986 |
| JP | 63-238705 | * 10/1988 |
| JP | H4-15812 | 2/1992 |
| JP | 5-299250 | 11/1993 |
| JP | 06-176933 | 6/1994 |
| JP | 06176966 | 6/1994 |
| JP | 07297033 | 11/1995 |
| JP | 10116739 | 5/1998 |
| JP | 11307345 | 11/1999 |
| JP | 11340055 | 12/1999 |
| JP | 2000013167 | 1/2000 |

* cited by examiner

Primary Examiner—Seungsook Ham
(74) Attorney, Agent, or Firm—RatnerPrestia

(57) ABSTRACT

A filter includes a substrate with a relative dielectric constant of 200 or less and a thickness of 0.1 mm or more. A first electrode is disposed on at least one surface of the substrate, a group of second electrodes is disposed on at least the other surface of the substrate. Each of the second electrodes is not in contact with each other and is not in contact with the first electrode. The filter also includes a chip type inductance element. The chip type inductance element has an inductance ranging from 0.1 nH to 30 nH and has dimensions of L1 in length, L2 in width and L3 in height, which satisfy the following conditions;

0.3 mm<L1<2.1 mm 0.1 mm<L2<1.1 mm 0.1 mm<L3<1.1 mm.

16 Claims, 14 Drawing Sheets

FILTER

BACKGROUND OF THE INVENTION

The present invention relates to a filter for use in such electronic equipment as used in mobile communication apparatus and the like, particularly intended for dealing with high frequency signals.

LC filters, each formed of inductance elements, capacitor elements and the like that are mounted on a substrate, are disclosed in the Japanese Patent Application Laid Open Publication No. H06-176933, the Japanese Utility Model Application Laid Open Publication No. H04-15812 and the like. The other prior art examples are disclosed in the Japanese Utility Model Application Laid Open Publication No. S61-9918, the Japanese Patent Application Laid Open Publication No. 2000-13167 and the like.

However, according to the structure of filters as disclosed in the aforementioned patents and utility models, no conditions are described with regard to inductance elements that are suitable for use in the filters, particularly when the filters are used in a high frequency region. In addition, such problems as an increasing number of components and a resultant fairly bulky filter configuration have been turning out serious.

SUMMARY OF THE INVENTION

A filter of the present invention comprises:

a substrate with a relative dielectric constant of 200 or less and a thickness of 0.1 mm or more;

a first electrode disposed on at least one surface of the substrate;

a group of second electrodes disposed on at least the other surface of the substrate, each of the group of second electrodes being not in contact with each other and also being not in contact with the first electrode; and a chip type inductance element, whose terminals are connected with at least two electrodes selected from the group of second electrodes directly or via a conductive adhesive.

The chip type inductance element has an inductance ranging from 0.1 nH to 30 nH and has dimensions of L1 in length, L2 in width and L3 in height, which satisfy the following conditions.

0.3 mm<L1<2.1 mm 0.1 mm<L2<1.1 mm 0.1 mm<L3<1.1 mm

According to the structure disclosed in the present invention, a filter that can realize at least one of such features as having suitable filter characteristics particularly in a high frequency region, realizing a reduction in size and a reduction of a number of components is obtained.

DETAILED DESCRIPTION OF THE INVENTION

Figure 1:
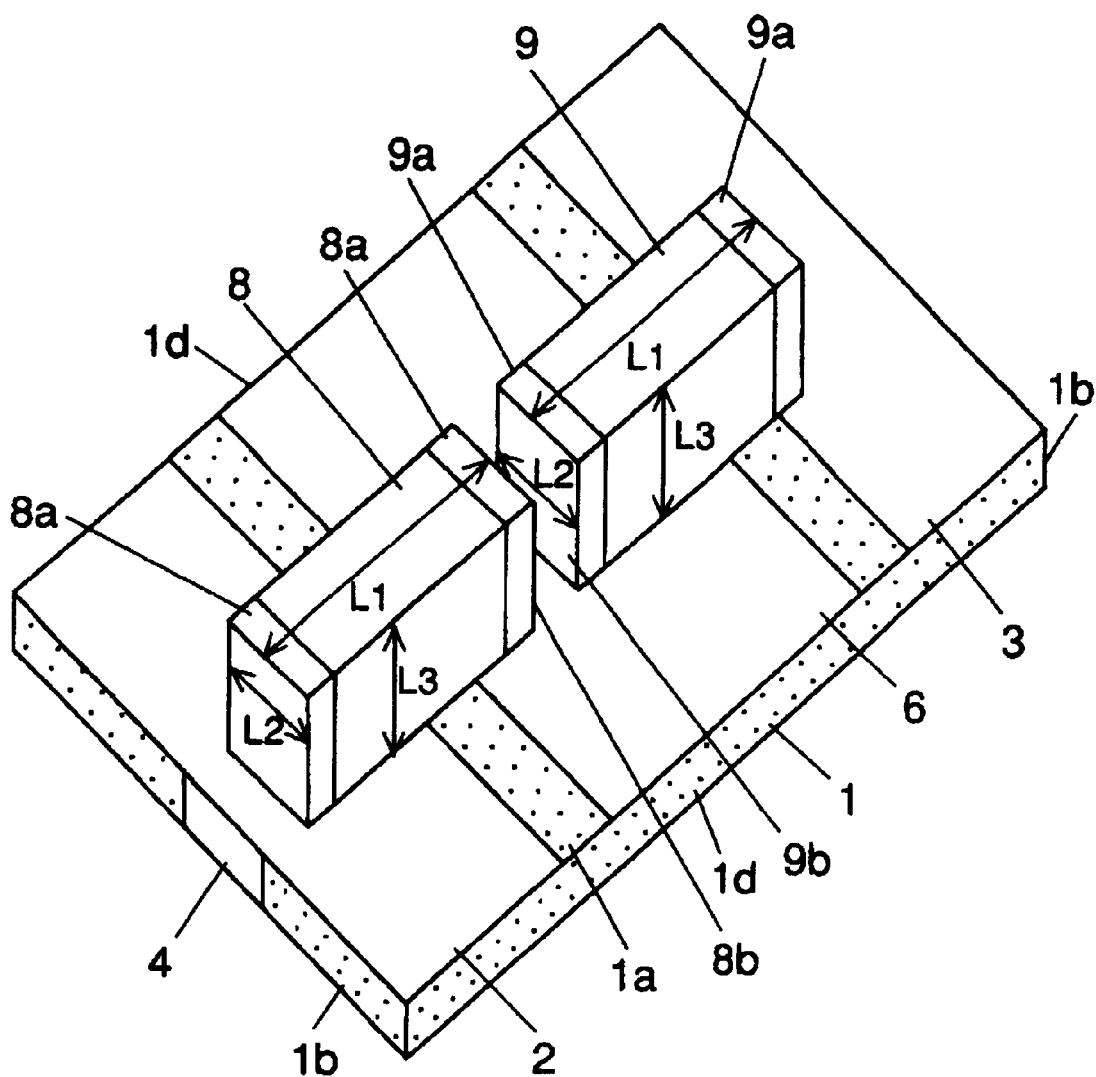
FIG. 1 is a perspective view of a filter in an exemplary embodiment of the present invention.
Figure 2:
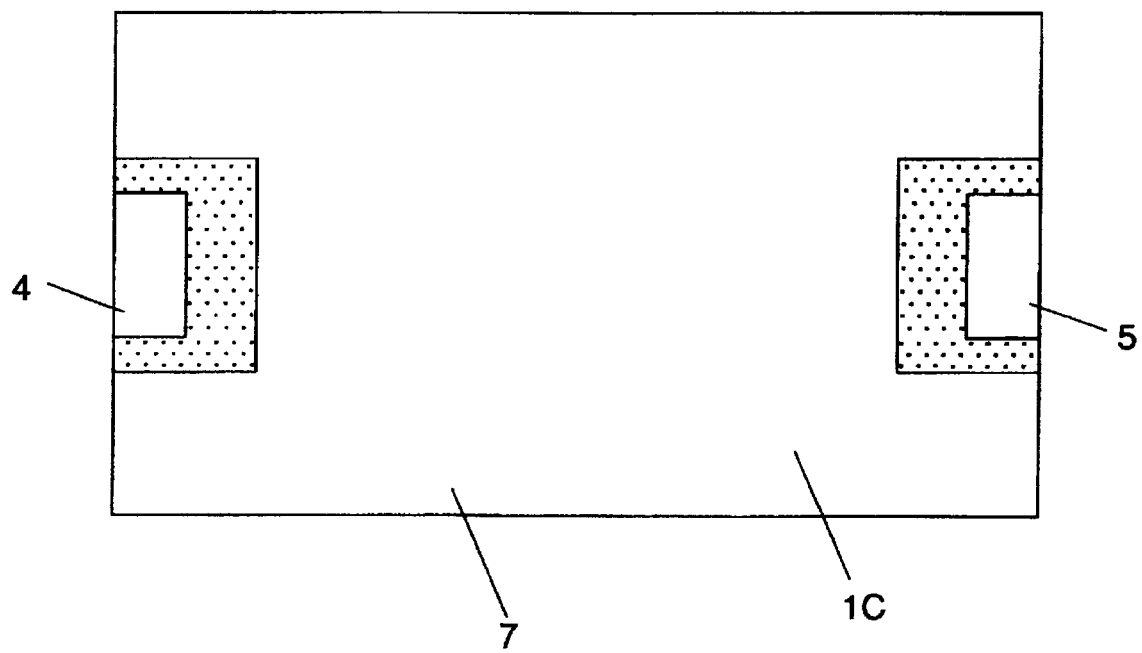
FIG. 2 is a bottom view of the filter in the exemplary embodiment of the present invention.

FIG. 1 and FIG. 2 show a perspective view and a bottom view of a filter in an exemplary embodiment of the present invention, respectively.

In FIG. 1 and FIG. 2, a substrate 1 is shaped like a square plate, a disc plate, an oval plate and the like. In particular, the square plate shape facilitates the positioning of the filter on a circuit board provided inside of electronic equipment and the like.

The material constituting the substrate 1 is a resin material such as a glass epoxy resin, a ceramic material and the like, or laminates formed of the foregoing resin and ceramic materials. It is particularly preferred that a ceramic substrate with a relative dielectric constant of 200 or less (preferably 150 or less) is employed. More specifically, it is preferable to use a low loss and excellent temperature stability material such as a barium titanate base dielectric ceramic. By keeping the relative dielectric constant of the substrate 1 less than 200, an adjustment of filter characteristics can be performed easily when the filter characteristics are adjusted by, for example, scraping part of the substrate 1. Since the rate of change in characteristics is not excessively large against a given amount of the scraped portion of the substrate 1. Further, with the relative dielectric constant of the substrate 1 being 200 or less, a filter operable at high frequencies can be prepared easily. In addition, in order to make the substrate 1 strong enough mechanically, the thickness thereof is to be made preferably more than 0.1 mm. When the substrate 1 is formed by stacking a plurality of multi-layer sheets, an electrode is disposed between the sheets themselves, thereby producing a capacitance between two adjacent electrodes, or the electrode disposed between the sheets is allowed to be an inductor. In other words, at least a function of a capacitor or an inductor is allowed to be incorporated in the substrate 1 itself. Accordingly, the substrate 1 itself is allowed to possess the function to work as at least one selected from a group of a high-pass filter, band-pass filter, duplexer, coupler, balun, divider and the like in addition to a low-pass filter.

An electrode 2 provided on the end part of the substrate 1 is formed on the main surface 1a of the substrate 1 and an electrical connection is made between the electrode 2 and an electrode 4 which is formed by extending from the side surface 1b to the bottom surface 1c of the substrate 1 and also can be used as a terminal. Further, the electrode 4 is allowed to be formed in one-piece with the electrode 2 or to be formed separately with a different material after the electrode 2 is formed.

Also, an electrode 3 is provided on the end part opposite to the electrode 2 on the main surface 1a of the substrate 1 and an electrical connection is made between the electrode 3 and an electrode 5 which is formed by extending from the side surface 1b to the bottom surface 1c of the substrate 1 as FIG. 2 shows and also can be used as a terminal. Further, the electrode 5 is allowed to be formed in one-piece with the electrode 3 or to be formed separately with a different material after the electrode 3 is formed.

An electrode 6, which is not in contact with electrodes 2 and 3 electrically, is formed on the main surface 1a the substrate 1, and an electrode 7 is formed on the bottom surface 1c of the substrate 1, thereby allowing the electrode 7 to be used as grounding electrode. U letter shaped notches are formed on the electrode 7 at the respective end parts thereof and the electrodes 4 and 5 are disposed in the respective notches, thereby allowing the electrodes 4 and 5 not to be brought into contact with the electrode 7 electrically. Accordingly, even when the electrodes 4 and 5 are brought into contact with lands on a circuit board, the possibility of short-circuiting between the electrodes 4 and 5 and the electrode 7 due to a solder bridging and the like can be decreased because of gaps existing between them.

Inductance elements 8 and 9 are disposed between the electrodes 2 and 6 and between the electrodes 3 and 6, respectively.

The inductance elements 8 and 9 are chip type surface mount components and have terminals 8a and 9a disposed on both end parts thereof, and terminals 8a and 9a can be connected directly to the electrodes 2, 3 and 6, respectively. The terminals 8a and 9a and the electrodes 2, 3 and 6 are joined by means of conductive jointing materials such as solder, lead free solder and the like.

According to the present invention, the dimensions of the inductance elements 8 and 9 forming the inductance components for a filter preferably satisfy the conditions as follows:

0.3 mm<L1<2.1 mm 0.1 mm<L2<1.1 mm 0.1 mm<L3<1.1 mm where L1 is a length, L2 is a width and L3 is a height of the inductance element.

When L1 is 0.3 mm or less, the length of the inductance element becomes too short to maintain a predetermined inductance and, when L1 is 2.1 mm or more, the inductance element itself becomes bulky, thereby making it rather difficult to reduce a size of the filter.

When L2 and L3 are 0.1 mm or less, respectively, the mechanical strength of the inductance element decreases with a resulting danger of breakage of the inductance element at the time of mounting the inductance elements 8 and 9 on the substrate 1. And, when L2 and L3 are 1.1 mm or more, respectively, the inductance element itself becomes bulky, thereby making it rather difficult to reduce a size of the filter.

Further, the inductance of the inductance elements 8 and 9 preferably ranges from 0.5 nH to 30 nH, thereby allowing the filter to perform in a high frequency region with sufficiently excellent characteristics.

In addition, it is preferred that the Q factor of the inductance elements 8 and 9 is 20 or more (preferably 25, and more preferably 30) at frequencies exceeding 1 GHz. Further, even though the Q factor is 18 at 1 GHz, for example, it is acceptable if the Q factor is 20 or more at 1.1 GHz.

In the present exemplary embodiment, with the electrodes 4 and 5 disposed on the substrate 1 by extending over the side surface 1b and bottom surface 1c of the substrate 1, the electrodes 4 and 5 are joined to lands of other circuits directly or indirectly by means of conductive jointing materials such as solder, lead free solder and the like, thereby realizing a filter for surface mounting. However, the configuration of the filter of the present invention is not limited to the foregoing. More specifically, in accordance with the conditions of the lands and the like of the circuit board, on which this filter is mounted, the electrodes 4 and 5 are allowed to be formed by extending only over the side surface 1b, not over the bottom surface 1c. Or the electrodes 2 and 3 are also allowed to be joined directly to the lands and the like of the circuit board without using the electrodes 4 and 5 by means of a gold wire and the like using a wire bonding method.

Furthermore, although only one electrode of the respective electrodes 4 and 5 that act as terminals is provided to the electrodes 2 and 3, respectively, in the present exemplary embodiment, a plurality of electrodes serving as terminals are allowed to be provided, thereby enhancing the jointing ability in surface mounting.

Next, a description is given to the electrodes 2, 3, 4, 5, 6 and 7 (hereinafter referred to as "electrodes").

As the materials to constitute the electrodes, pure metallic materials such as gold, silver, copper, aluminum, nickel and the like, alloys formed of the foregoing metallic materials and alloys formed of the foregoing metallic materials and other metallic materials are suitable for use. In addition, the conductive jointing materials such as solder, lead free solder and the like can also be provided as electrodes and the like. Silver or silver alloys remain the particularly preferred choice for the electrodes.

When an electrode is formed in a single layer structure or in a multi-layer structure, it is preferred for the sake of assuring reliability in soldering that the total thickness of the electrode ranges from 10 μm to 30 μm.

As the methods for forming electrodes, a plating method, a coating method, a printing method and the like are used. When the plating method is used to form electrodes and the like, a plating resist and the like are used in masking areas where no electrodes are to be formed on the substrate 1 and a base layer is formed by an electroless plating method. Thereafter, an electrode and the like are formed on the base layer by an electroplating method.

When the coating method is used to form electrodes, pastes such as a silver paste and the like are applied on areas where electrodes are to be formed on the substrate 1 and then a heat treatment is applied thereto, thereby finishing the electrodes.

Similarly with the coating method, a paste is printed on the substrate 1 according to the patterns of electrodes and then a heat treatment is applied thereto, thereby finishing the electrodes.

Also, the electrodes are allowed to be prepared in a single layer structure by the use of one material or in a multi-layer structure, too. On the surface of an electrode formed of silver, for example, a joining layer formed of jointing materials such as solder, lead free solder and the like is allowed to be formed.

Providing that respective electrodes are formed of one material in an identical structure, the same process is allowed to be employed in preparation of the electrodes, resulting in such benefits as enhancing productivity and the like. But it does not matter whether the constituting materials and the structure for the respective electrodes are changed. For instance, since the electrodes 4 and 5 and the electrode 7 are often joined to lands on a circuit board, it is considered that a joining layer formed of solder and the like is prepared on the electrodes 4, 5 and 7 separately from other electrodes. Or an anticorrosive layer (formed of nickel and the like) may be is further formed thereon.

Thus, by making the material and structure of each respective electrode vary from electrode to electrode, a higher degree of freedom in surface mounting the components can be realized.

Figure 3:
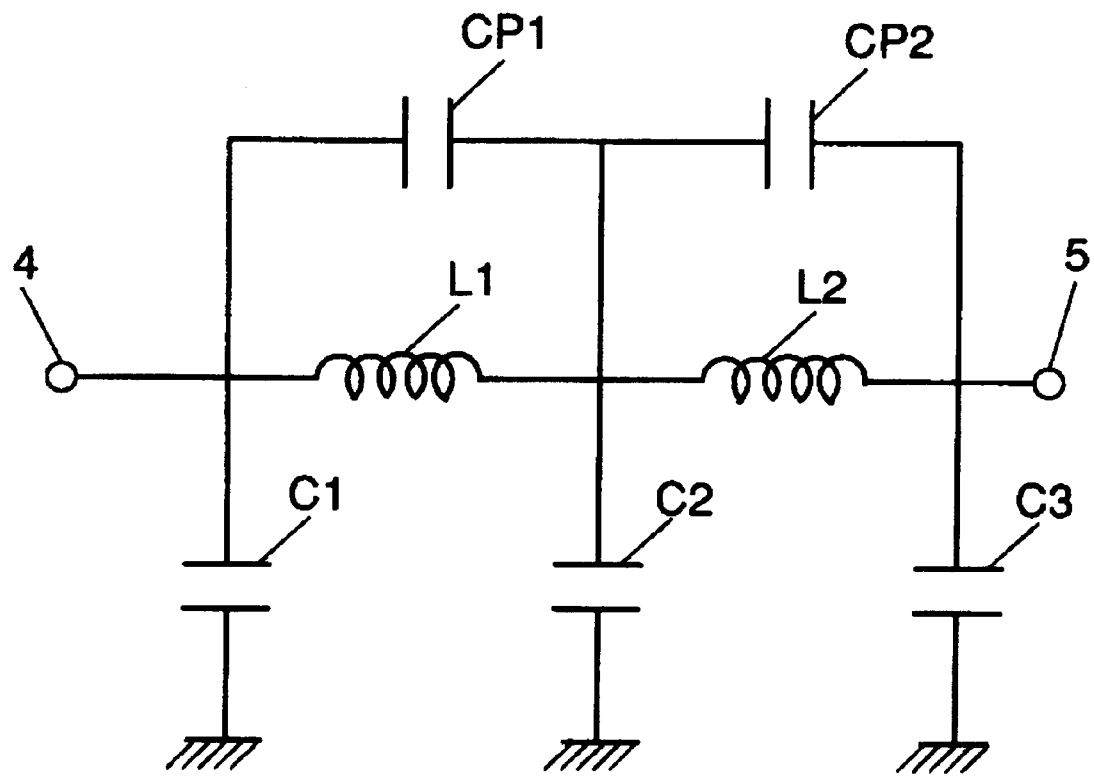
FIG. 3 is an equivalent circuit diagram of the filter in the exemplary embodiment of the present invention.

FIG. 3 is an equivalent circuit diagram of the filter structured as described above.

In FIG. 3, the electrodes 4 and 5 form terminals for the filter. However, when the electrodes 4 and 5 are omitted as described above, the electrodes 2 and 3 serve as terminals. Inductance L1 is provided by the inductance element 8 and inductance L2 is provided by the inductance element 9. Capacitance C1 is formed between the electrode 2 (or the electrodes 2 and 4) and the electrode 7, capacitance C2 is formed between the electrodes 6 and 7 and capacitance C3 is formed between the electrode 3 (or the electrodes 3 and 5) and the electrode 7. CP1 is capacitance formed between the electrodes 2 and 6 and CP2 is capacitance formed between the electrodes 3 and 6. Thus, a relatively large capacitance of C1 is obtained by making the electrode 2 located approximately opposite to the electrode 7 via the substrate 1, a dielectrics, and similarly a relatively large capacitance of C3 is obtained by making the electrode 3 located approximately opposite to the electrode 7 via the substrate 1.

When inductance L1 and L2 are to be changed, this can be achieved by changing inductance of the inductance elements 8 and 9 to be mounted and capacitance C1, C2 and C3 can be changed by varying the respective forming area of the electrodes 2, 3 and 6, for example. Further, the capacitance CP1 and CP2 can be adjusted by varying the distance between the electrodes 2 and 6 and the width of sections opposing to each other. As is explained, adjustments of the parameters can be readily carried out. The resulting circuit thus obtained can be used generally as a low pass filter.

Next, a description is given to the specific structure of inductance elements 8 and 9.

As the inductance elements 8 and 9 are used most suitably a trimming type inductance element, a plating type inductance element, a wire winding type inductance element, a buried type inductance element, which has a coil buried in an insulating material or in a magnetic material, and the like. With respect to the plating type and wire winding type, a detailed description is made later.

The buried type is prepared by the steps of forming a U letter shaped conductive layer on one surface of an insulating sheet, stacking a plurality of the sheets in layers, providing via-holes and the like to join the conductive layers with one another by way of the via-holes, thereby forming a structure, in which a spiral shaped coil is formed in the laminate. Or the buried type is prepared by the steps of preparing a coil by winding a wire in a spiral form and burying the coil directly in an insulating material or in a magnetic material.

Now, a description is given to an inductance element of the trimming type.

Figure 4:
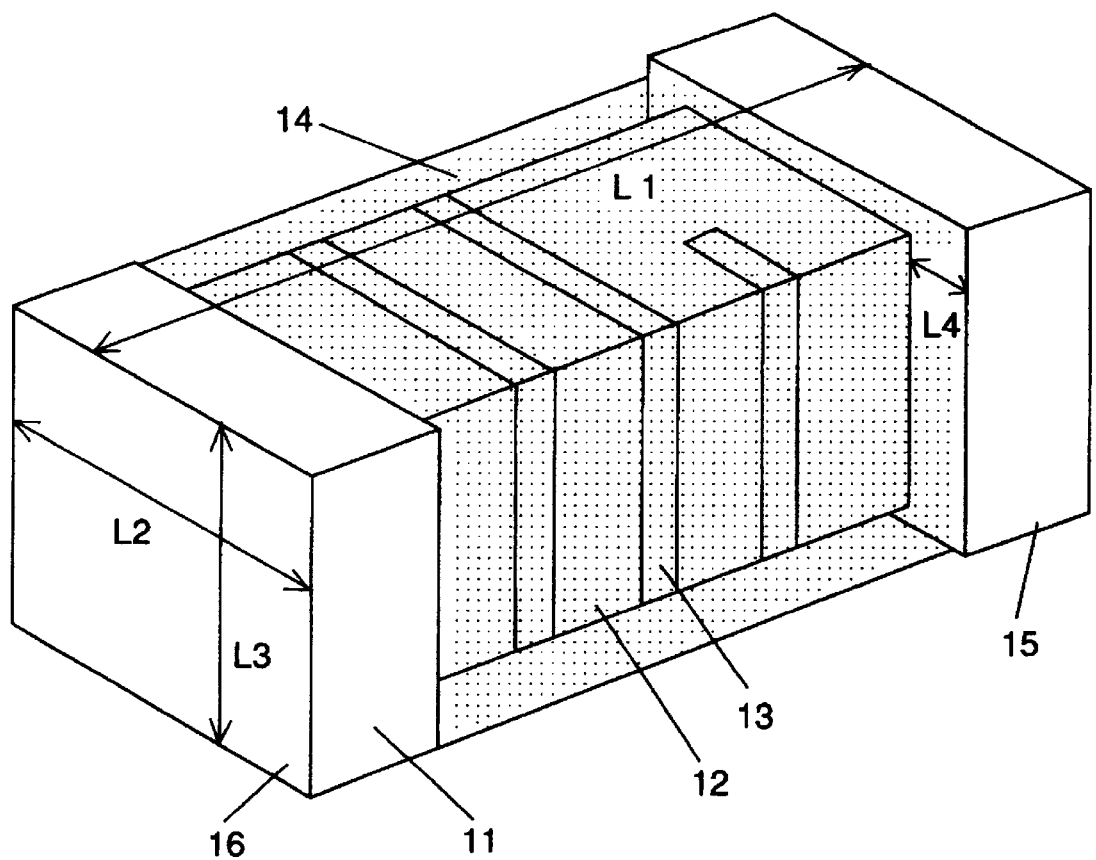
FIG. 4 is a perspective view of an inductance element employed in the filter in the exemplary embodiment of the present invention.

FIG. 4 is a perspective view of an inductance element for a filter in an exemplary embodiment of the present invention.

In FIG. 4, a conductive film 12 made of a conductive material such as copper, a copper alloy and the like is formed on the surface of a base 11 formed of an insulating material such as alumina and the like or a magnetic material such as ferrite and the like. A groove 13 is formed in a spiral shape on the conductive film 12 by the use of a laser beam or a grindstone, thereby making the conductive film 12 to be a spiral shaped conductive film 12 (serving as a coil). A protective material 14 is disposed so as to cover the groove 13, and terminals 15 and 16 are joined to the electrodes 2, 3 and 6 as shown in FIG. 1 directly or indirectly via a conductive jointing material, for example.

With the inductance element thus constructed, the inductance thereof can be changed readily by adjusting the number of turns and the like of the groove 13. Since the conductive film 12 is fixed on the base 11, the characteristics of the inductance element can hardly be affected by an external force imposed thereto. Moreover, by controlling the surface roughness, thickness and constituting material of the conductive film 12, and, also, by controlling the constituting material, surface roughness and the like of the base 11 within a predetermined range, the Q factor can be made 20 or more even at the frequencies exceeding 1 GHz.

Next, a description is given to a wire winding type inductance element.

Figure 5:
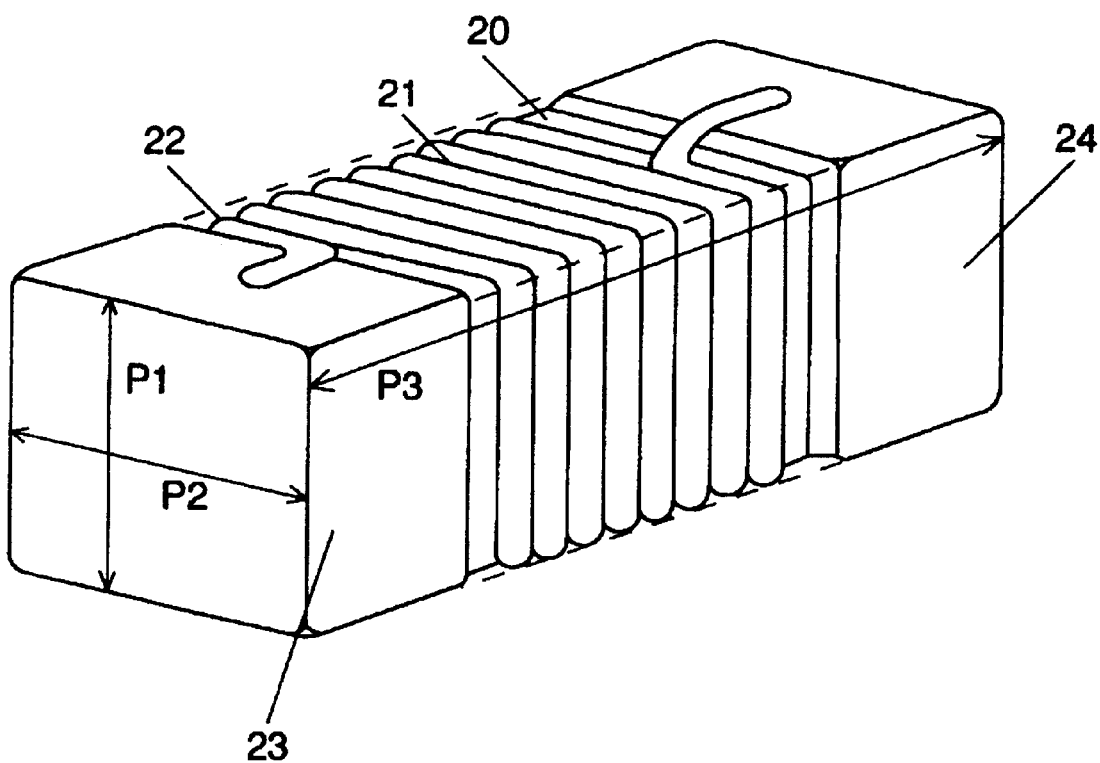
FIG. 5 is a perspective view of another inductance element employed in the filter in the exemplary embodiment of the present invention.

FIG. 5 is a perspective view of an inductance element for a filter in another exemplary embodiment of the present invention.

In FIG. 5, a winding wire 21 is wound in a spiral shape around a base 20 formed of an insulating material such as alumina and the like or a magnetic material such as ferrite and the like except for both ends thereof. The winding wire 21 is a conductive wire formed of copper or a copper alloy with a coating applied onto the surface thereof is most suitably used. There is provided a protective material 22 so as to enclose the winding wire 21. The ends of the winding wire 21 are joined to terminals 23 and 24 made of a conductive film and the like, respectively, by a hot pressing method, a laser welding method and the like.

An inductance element thus constructed can be adjusted the inductance easily by changing the number of winding turns of the winding wire 21. Further, since a coil is formed of the winding wire 21, a loss in the coil is made smaller, thereby allowing a high Q factor to be gained The filter constructed as described above is allowed to have a wide range of inductance because of the use of the chip type inductance elements 8 and 9 as component to produce an inductance. Further, since the loss due to the filter is minimal, a wide range of filter characteristics is obtained and the filter has an excellent efficiency. Moreover, a further reduction in size of the filter becomes possible.

Although one inductance element 8 is disposed between the electrodes 2 and 6 and another inductance element 9 between the electrodes 3 and 6 in the present exemplary embodiment, a plurality of inductance elements also are allowed to be disposed between electrodes. Also, although the inductance elements 8 and 9 are mounted on the substrate 1 with a spacing provided therebetween as shown in FIG. 1 in the present exemplary embodiment, the inductance elements 8 and 9 are allowed to be mounted on the substrate 1 with no spacing provided between the terminals 8b and 9b to obtain a much smaller filter.

Further, although two inductance elements identical in size and construction with each other are used as the inductance elements 8 and 9, respectively, in the present exemplary embodiment, the inductance elements are allowed to be different from each other in size and construction. For example, when a large inductance is needed between the electrodes 2 and 6, a size of the inductance element 8 is made about 1.0 mm and about 0.5 mm in height and width, respectively, (what is called 1005 type inductor) and a size of the inductance element 9 is made about 0.6 mm in length and 0.3 mm in height and width (what is called 0603 type inductor), respectively. This structure allows the inductance element 8 between the electrodes 2 and 6 to have a larger inductance than that of the inductance element 9 due to an increase in size and allows the circuit design rather easy. Also, the structure characterized by the enlarged element size of the inductance element 8 as described in above, the Q factor can be enhanced. In the way written above, when the inductance 8 connected between the electrodes 2 and 6 is required to be low in loss, employing an inductance element with an increased size works effectively.

When an inductance element of the same size and with a small loss is needed to be used between the electrodes 2 and 6, a wire winding type inductance element of the same size can satisfy the requirement.

Thus, by making the inductance elements 8 and 9 different from each other in size and construction, the filter characteristics can be changed readily, thereby enabling the enhancement of filter productivity and the like without fail.

Figure 6:
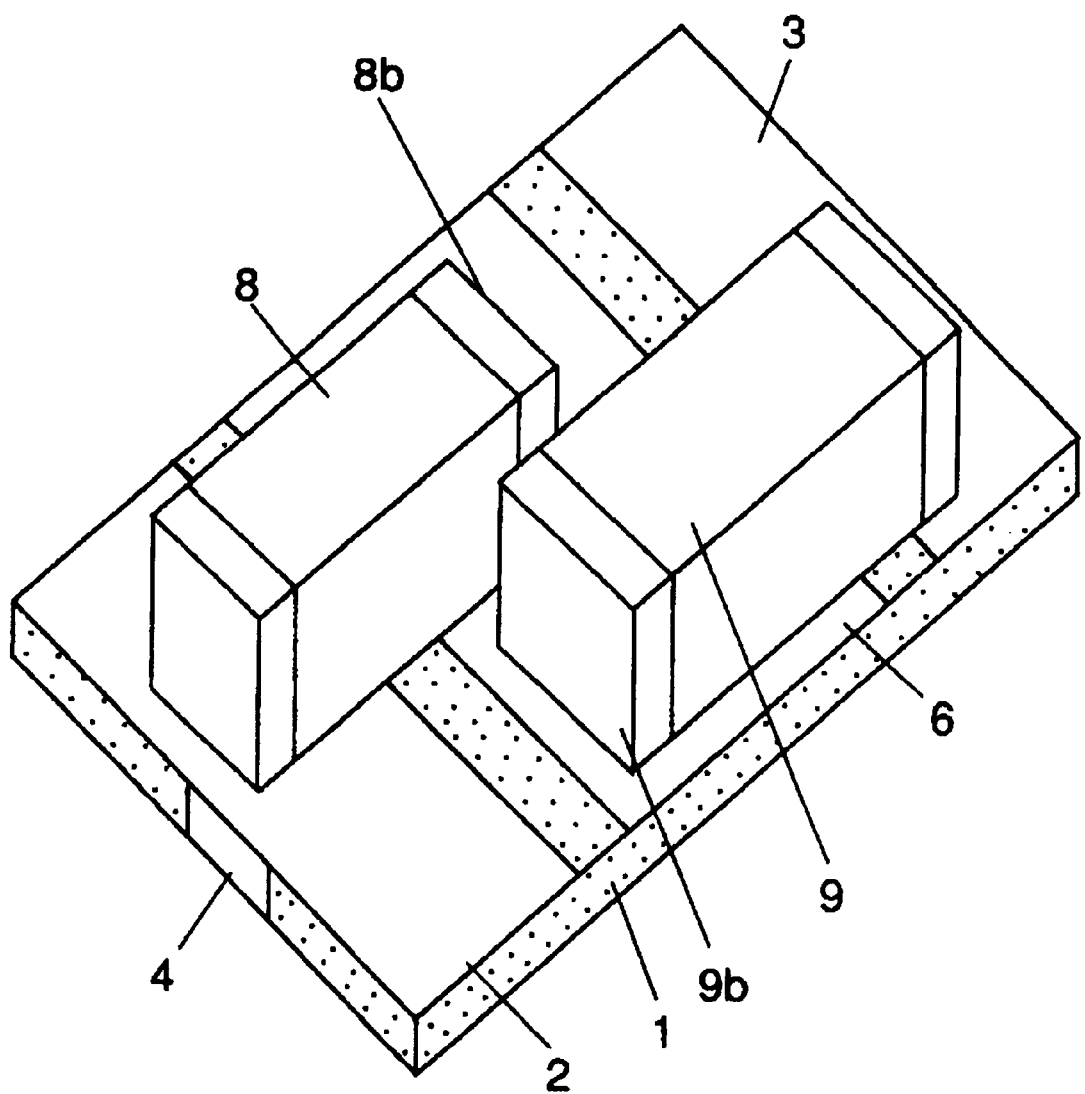
FIG. 6 is a perspective view of a filter in another exemplary embodiment of the present invention.

When the size of the substrate 1 is reduced (when a reduction is made in length, in particular), the inductance elements 8 and 9 may not be allowed to be mounted on the substrate 1 with the respective end surfaces 8b and 9b faced directly opposite to each other as FIG. 1 shows. In this case, the inductance elements 8 and 9 can be mounted on the substrate 1 so as to have the respective terminals 8b and 9b not faced opposite to each other directly as is shown in FIG. 6, thereby allowing the substrate 1 to achieve a further reduction in size. Furthermore, according to the structure in FIG. 6, the interference between the magnetic fluxes produced at the inductance elements 8 and 9 can be prevented, thereby reducing the variations in filter characteristics.

On the other hand, when a circuit design requires an interaction between the magnetic fluxes produced at the inductance elements 8 and 9, the inductance elements 8 and 9 are preferably mounted on the substrate 1 so as to have the terminals 8b and 9b faced directly opposite to each other as shown in FIG. 1.

Figure 7:
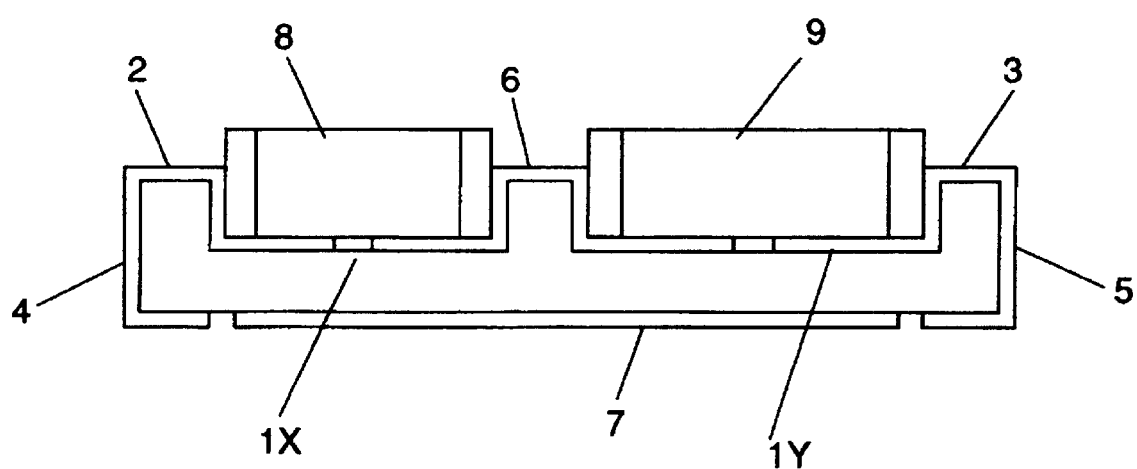
FIG. 7 is a side view of the filter in yet another exemplary embodiment of the present invention.

Further, the height of the inductance elements 8 and 9 projected above the upper surface of the substrate 1 can be reduced by having the inductance elements 8 and 9 buried partly or totally (not shown in the drawing) in recesses 1X and 1Y provided to the substrate 1 as shown in FIG. 7. According to this structure, the height of a resulting filter itself can be reduced and, in addition, the inductance elements 8 and 9 are securely fixed on the substrate 1, resulting in enhancement of a mechanical strength of the filter. Preferably, the electrodes 2 and 3 are disposed partly or at least part of the electrode 6 is disposed inside of the recesses 1X and 1Y as shown in FIG. 7. This structure allows the electrodes 2, 3 and 6 and the inductance elements 8 and 9 to be joined electrically with further reliability to prevent the variations in filter characteristics and the like from occurring.

Figure 9:
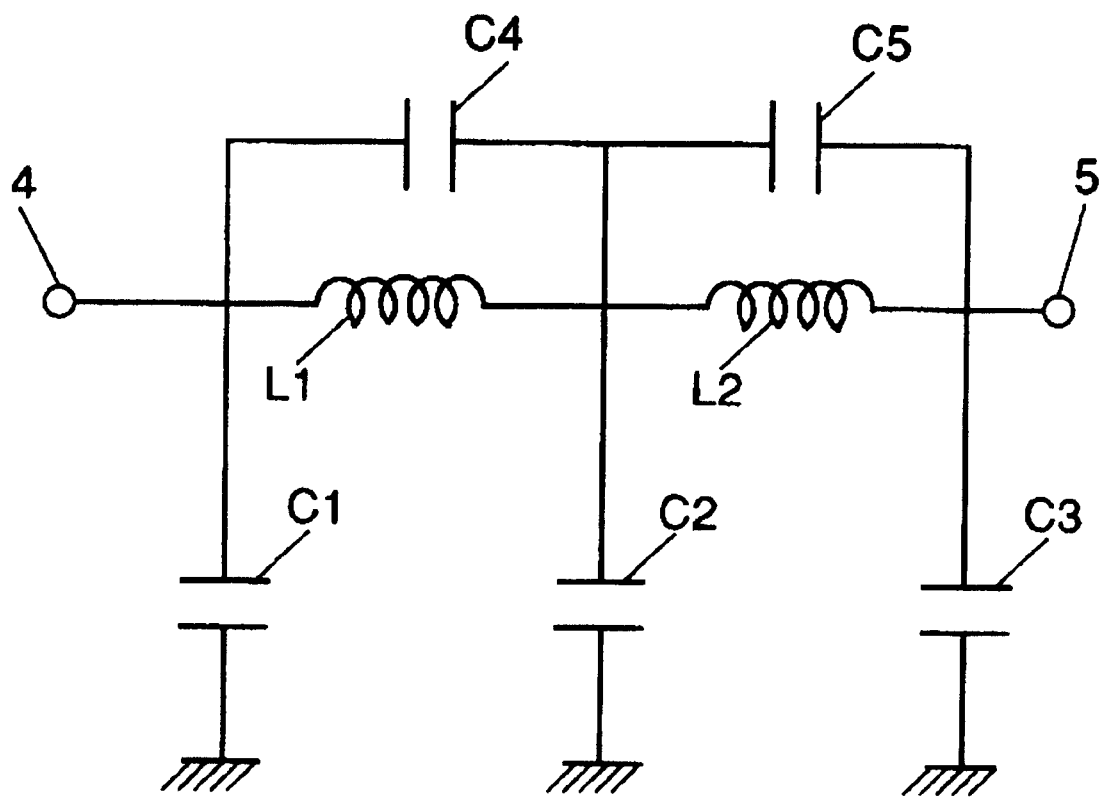
FIG. 9 is an equivalent circuit diagram of the filter of FIG. 6 in the foregoing another exemplary embodiment of the present invention.

Also, by having chip type capacitors 30 and 31 (a chip type component with terminals located at both ends thereof directly to join to electrodes 2, 3 and 6) placed on the substrate 1 in addition to the inductance elements 8 and 9, a filter with a higher degree of attenuation attainable can be constructed. More specifically, the inductance element 8 and capacitor 30 are connected between the electrodes 2 and 6 and the inductance element 9 and capacitor 31 are connected between the electrodes 3 and 6. FIG. 9 is an equivalent circuit diagram of the filter thus constructed. The capacitance C1, C2 and C3 and the inductance L1 and L2 are the same as in FIG. 3. C4 connected parallel to L1 is a combined capacitance of a capacitance of the capacitor 30 and the capacitance CP1 in FIG. 3 and C5 connected parallel to L2 is a combined capacitance of a capacitance of the capacitor 31 and the capacitance CP2 in FIG. 3. In the present exemplary embodiment described here, the capacitors 30 and 31 are connected between the electrodes 2 and 6 and between the electrodes 3 and 6, respectively. But, by having at least one of the capacitors 30 and 31 put in the place, a higher degree of attenuation can be obtained than the filters as shown in FIG. 1 and the like.

Although only one electrode 6 is disposed between the electrodes 2 and 3 in the present exemplary embodiment, a plurality of electrodes, which correspond to the electrode 6 and are not in contact with each other, may be disposed on the substrate 1 and chip type inductance elements may be disposed between the respective electrodes. This structure makes the filter to be bulky and degraded in insertion loss and the like. However, the resulting filter shows a steep cut-off characteristic and has a high degree of attenuation. Furthermore, by having a plurality of chip capacitors connected between the respective electrodes, the resulting filter is allowed to have further high degree of attenuation.

Figure 10:
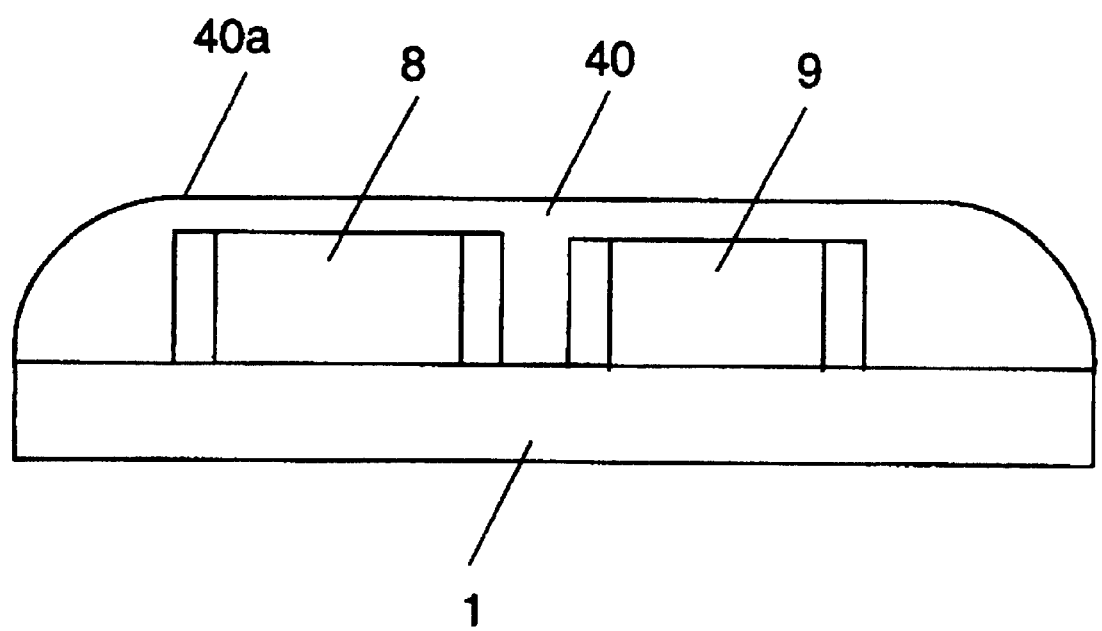
FIG. 10 is a side view of a filter in another exemplary embodiment of the present invention.

When a filter is mounted on a circuit board and the like by means of a mounting machine and the like, the filter has to be sucked with a suction nozzle of the mounting machine. However, with the filter as shown in FIG. 1 and the like, the protruded inductance elements 8 and 9 and the like make it difficult for the suction nozzle to suck the filter. Therefore, as FIG. 10 shows, a protective material 40 is applied at least onto the surface the substrate, on which the inductance elements 8 and 9 are mounted, to smooth the protrusions and recesses on the surface of the filter, thereby allowing the suction performance involved with the filter mounting to be improved. In addition, it is preferred that the surface 40a of the protective material 40 is made flat, thereby enabling the ability to suck the filter to be further enhanced. Resins such as epoxy resin, polystyrene resin, polyolefin resin and the like are suitable for use as the protective material 40.

Figure 11:
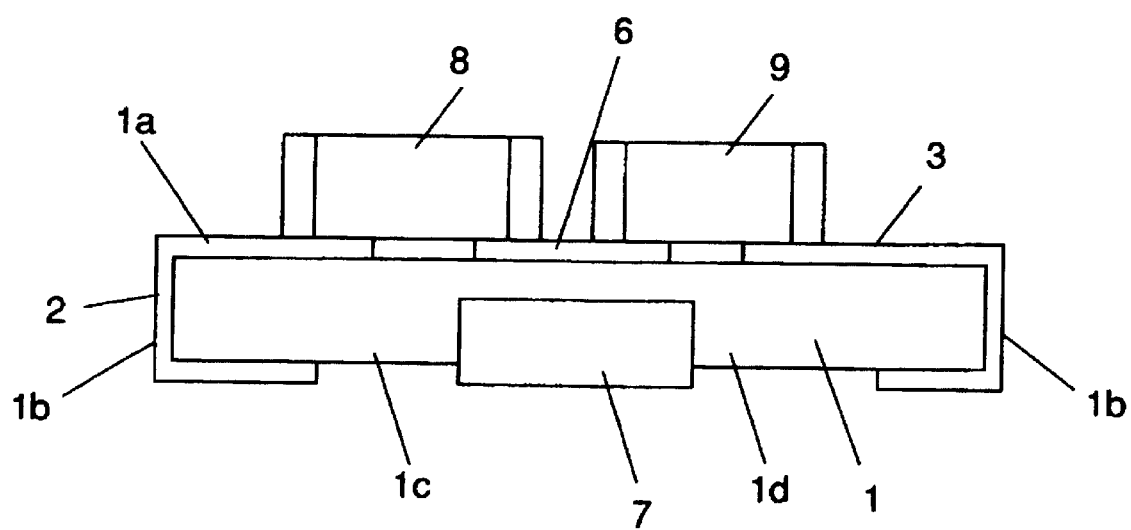
FIG. 11 is a side view of a filter in another exemplary embodiment of the present invention.

FIG. 11 is a side view of a filter in another exemplary embodiment of the present invention. According to the circuitry structure as employed in the filter of FIG. 11, so called T type filter can be obtained. The filter thus constructed differs from the filter shown in FIG. 1 and the like in having the electrodes 2 and 3 disposed over the main surface 1a, side surface 1b and another main surface 1c with part of the respective electrodes 2 and 3 used as a terminal electrode, and also in having the electrode 7 disposed over the side surface 1d, the side surface located opposite to the side surface 1d although not shown in the drawing and main surface 1c.

Figure 12:
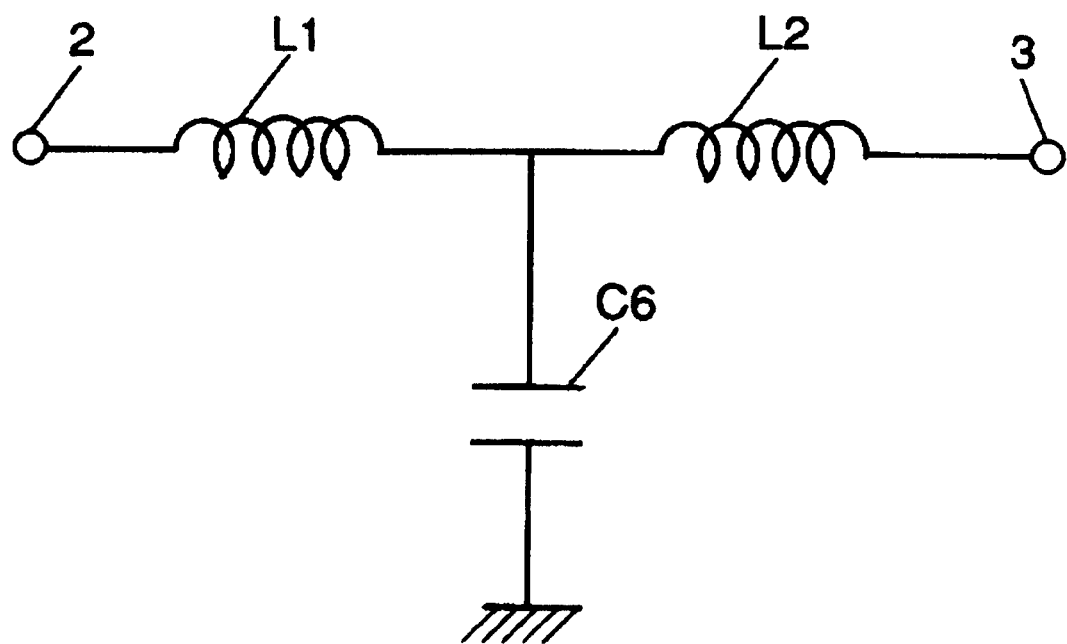
FIG. 12 is an equivalent circuit diagram of the filter in the foregoing still another exemplary embodiment of the present invention.

As a result, the opposed area between the electrodes 6 and 7 via the substrate 1 increases, thereby increasing the capacitance between the electrodes 6 and 7. And, at the same time, the opposed respective areas between the electrodes 2 and 3 and the electrode 7 are reduced, thereby allowing the capacitance between the electrodes 2 and 3 and the electrode 7, respectively, to be reduced. FIG. 12 is an equivalent circuit diagram of the filter constructed above. In FIG. 12, L1 and L2 stand for the inductance of the inductance elements 8 and 9, respectively, and C6 stands for the capacitance produced between the electrodes 6 and 7. Although there exists a capacitance between the electrodes 2 and 3 and the electrode 7, respectively, the capacitance is negligibly small since the capacitance is almost like a stray capacitance.

Figure 13:
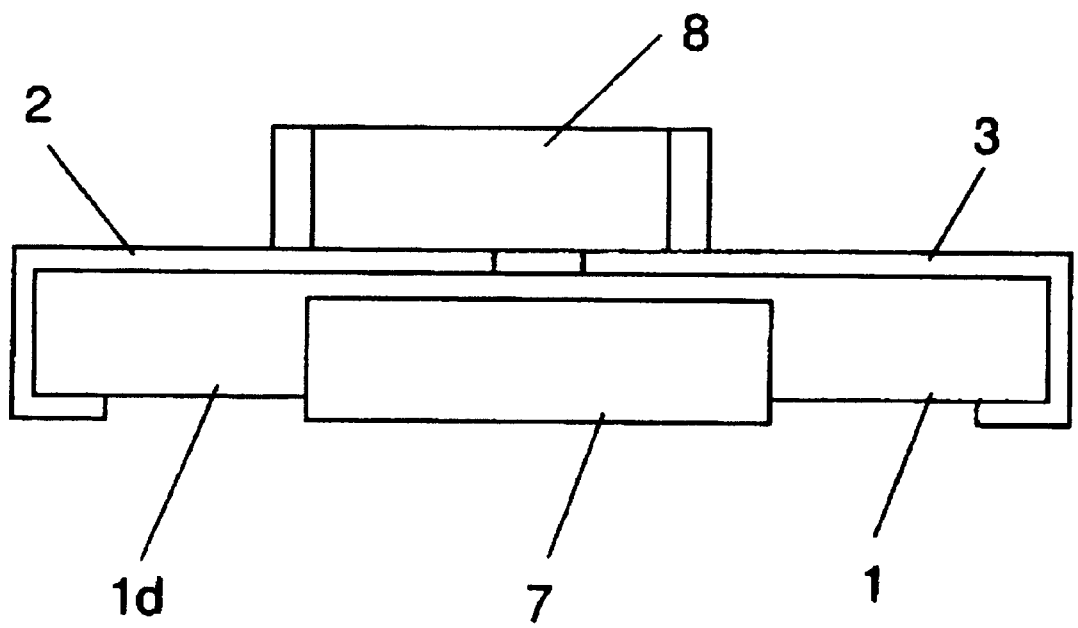
FIG. 13 is a side view of a filter in another exemplary embodiment of the present invention.
Figure 14:
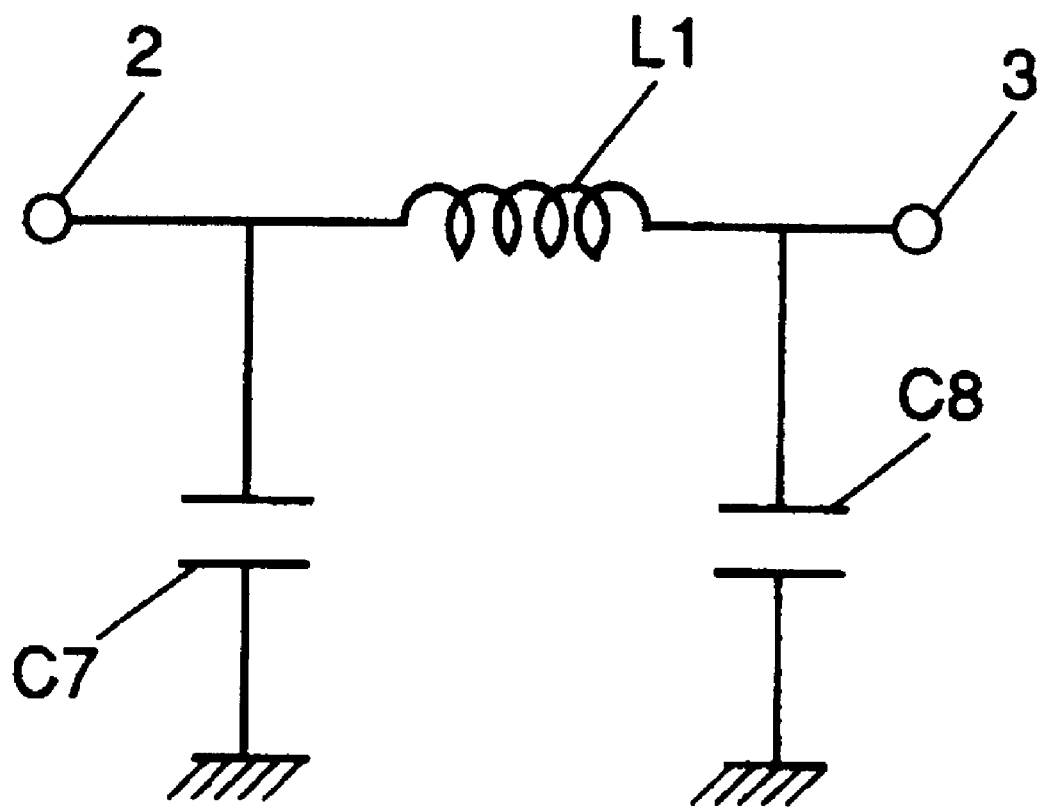
FIG. 14 is an equivalent circuit diagram of the filter in the another exemplary embodiment of the present invention.

FIG. 13 is a side view of a filter in still another exemplary embodiment of the present invention. According to the circuitry structure employed in the filter of FIG. 13, so called π type filter can be obtained. The filter thus constructed differs from the filter as shown in FIG. 1 and the like in having the electrodes 2 and 3 disposed over the main surface 1a, side surface 1b and another main surface 1c with part of the respective electrodes 2 and 3 used as a terminal electrode. The filter also differs in having the electrode 7 disposed over the side surface 1d, the side surface located opposite to the side surface 1d although not shown in the drawing and main surface 1c and further in having the electrode 6 and inductance element 9 omitted from the filter. As a result, the capacitance between the electrodes 2 and 3 and the electrode 7 increases by having the opposed areas between the electrodes 2 and 3 and the electrode 7 via the substrate 1 increased. FIG. 14 is an equivalent circuit diagram of the filter thus structured. In FIG. 14, L1 stands for an inductance produced by the inductance element 8 and C3 and C4 stand for a capacitance produced between the electrodes 2 and 3 and the electrode 7, respectively.

With the filters as shown in FIG. 11 and FIG. 13, the electrode 7 is disposed over the side surface 1d, the side surface opposing thereto and the main surface 1c. The side electrodes thus formed not only facilitate the adjustment of the capacitance produced between other electrodes but also enhance the reliability of soldering the electrodes of the filter to the lands and the like on a circuit board, since fillet is made.

Also with the filer show in FIG. 1 and FIG. 2, it is needless to say that the electrode 7 is disposed over the side surface 1d to obtain the same effect as above.

The present invention discloses a filter comprising:
an insulating substrate with a relative dielectric constant of 200 or less;
a first electrode disposed on a main surface of the substrate;
a plurality of second electrodes disposed on the other main surface of the substrate, the second electrodes being not in contact with the first electrode and also with each other; and
a chip type inductance element, which has a terminal at both ends thereof, respectively, disposed between the second electrodes, in which the terminals of the inductance element are joined with the second electrodes directly or via a conductive jointing material. Furthermore, the inductance element has an inductance ranging from 0.1 nH to 30 nH and a Q factor of 20 or more. As a result, it is made possible to obtain a filter having a reduced insertion loss and provided with excellent filter characteristics over high frequency ranges.

Figure 8:
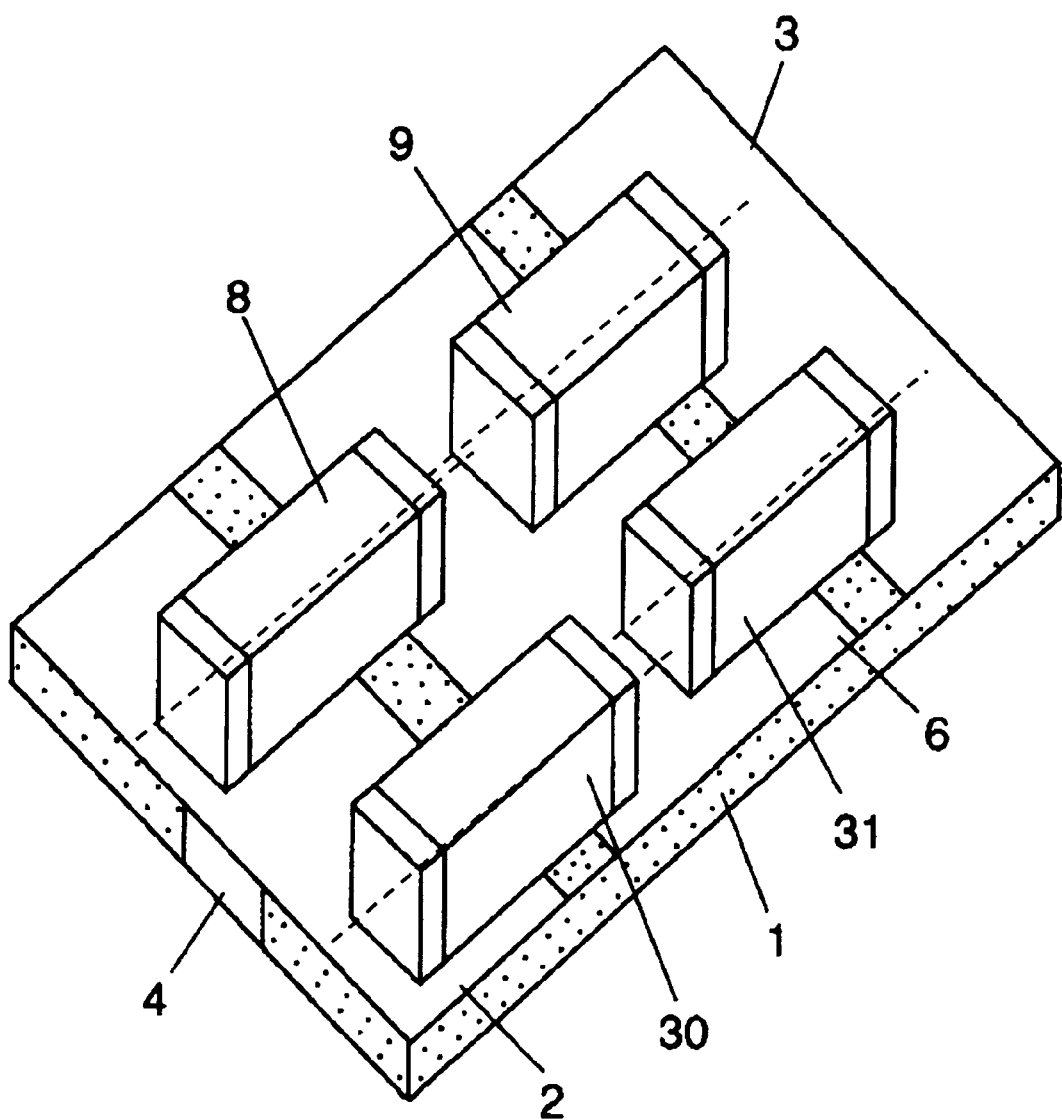
FIG. 8 is a perspective view of a filter in still another exemplary embodiment of the present invention.

In addition, a filter in an exemplary embodiment of the present invention has chip components mounted on a substrate 1 in such a way as the center lines (dotted lines in FIG. 8) connecting between the terminals of each respective chip component as FIG. 8 shows, for example, are aligned in the same direction. This structure allows the chip components to be arranged in an orderly manner and facilitating the process of chip component mounting with high productivity.

What is claimed is:

1. A filter comprising:

a substrate with a dielectric constant of 200 or less, said substrate having a first surface, a second surface, and a side surface between said first and said second surfaces;

a first electrode disposed on at least said first surface;

a group of second electrodes disposed on at least said second surface, each of said second electrodes not in contact with each other and not in contact with said first electrode, and a portion of said group of second electrodes being located directly opposite a portion of said first electrode via said substrate to form at least one capacitance; and a plurality of inductance elements, each of said inductance elements having terminals, each of said terminals connected to at least two electrodes selected from said group of second electrodes and said inductance elements having an inductance ranging from 0.1 nH to 30 nH and dimensions L1 in length, L2 in width and L3 in height, said dimensions satisfying conditions as follows;

0.3 mm<L1<2.1 mm 0.1 mm<L2<1.1 mm 0.1 mm<L3<1.1 mm wherein at least one of said plurality of inductance elements being different in structure from other said inductance elements.

2. The filter of claim 1, wherein said first electrode is a grounding electrode and at least two electrodes of said group of second electrodes are input and output terminals.

3. The filter of claim 1, wherein at least one of said plurality of inductance elements has a Q factor of 20 or more at a frequency exceeding 1 GHz.

4. The filter of claim 1, wherein said dimensions of at least one inductance element of said plurality of inductance elements being different from said dimensions of another inductance element.

5. The filter of claim 1, wherein at least one element of said plurality of inductance elements includes a conductive film having a spiral groove therein and a protective material on said conductive film.

6. The filter of claim 1, wherein at least one element of said plurality of inductance elements having terminals, a base between said terminals, and a wire wound around said base, said wire having ends which are joined respectively to said terminals.

7. The filter of claim 1, wherein a chip type capacitor is connected in parallel with at least one element of said plurality of inductance elements.

8. The filter of claim 1, further comprising a recess on a surface of said substrate, at least one part of at least one element of said plurality of inductance elements being disposed in said recess.

9. The filter of claim 1, further comprising a protective material provided on a surface of said substrate, on which at least one element of said plurality of inductance elements is disposed.

10. The filter of claim 1, wherein said first electrode and said group of said second electrodes are formed of at least one selected from a group of silver, copper, a silver alloy, and a copper alloy.

11. The filter of claim 1, wherein said substrate is made of a ceramic material.

12. The filter of claim 4, wherein said plurality of inductance elements each have center lines, said center lines of at least two inductance elements of said plurality of inductance elements are aligned in a same direction.

13. The filter of claim 4, wherein:
one terminal of a first inductance element and one terminal of a second inductance element are connected to one electrode selected from said group of second electrodes; and
another terminal of said first inductance element and another terminal of said second inductance element are connected respectively to two electrodes selected from said group of second electrodes.

14. The filter according to claim 1, wherein said substrate has a thickness of 0.1 mm or more.

15. The filter according to claim 1, wherein at least one element of said plurality of inductance elements is a trimming type inductance element, a plating type inductance element, a wire winding type inductance element, or a buried type inductance element.

16. The filter according to claim 1, wherein a capacitor or an inductor is incorporated in the substrate.

* * * * *